United States Patent
Yeo

(10) Patent No.: US 9,494,633 B2
(45) Date of Patent: Nov. 15, 2016

(54) ELECTROMAGNETIC INTERFERENCE MEASURING DEVICE AND ELECTROMAGNETIC INTERFERENCE MEASURING METHOD

(71) Applicant: Electronics and Telecommunications Research Institute, Daejeon (KR)

(72) Inventor: Soon Il Yeo, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 540 days.

(21) Appl. No.: 14/027,573

(22) Filed: Sep. 16, 2013

(65) Prior Publication Data
US 2014/0167782 A1 Jun. 19, 2014

(30) Foreign Application Priority Data
Dec. 14, 2012 (KR) .................. 10-2012-0146840

(51) Int. Cl.
G01R 27/28 (2006.01)
G01R 31/00 (2006.01)
G01R 29/08 (2006.01)

(52) U.S. Cl.
CPC ......... *G01R 31/002* (2013.01); *G01R 29/0814* (2013.01); *G01R 29/0835* (2013.01); *G01R 31/001* (2013.01)

(58) Field of Classification Search
CPC G01R 29/0814; G01R 29/26; G01R 31/001; G01R 31/002; G01R 29/0835
USPC .................. 324/612, 613, 627, 628
See application file for complete search history.

(56) References Cited

U.S. PATENT DOCUMENTS

| 6,242,925 B1 | 6/2001 | Schutten et al. |
| 2006/0181287 A1* | 8/2006 | Motohashi ........... G01R 31/002 324/613 |
| 2007/0077794 A1* | 4/2007 | Chen .................... H05K 1/0215 439/108 |

FOREIGN PATENT DOCUMENTS

KR 10-0834422 B1 6/2008

OTHER PUBLICATIONS

Cristian A Vram, et al., "Characterization of Miniature Near Field Probes for IC's Radiation Measurements", IEEE, pp. 275-278, 2010.

* cited by examiner

*Primary Examiner* — Amy He
(74) *Attorney, Agent, or Firm* — Rabin & Berdo, P.C.

(57) ABSTRACT

Provided is an electromagnetic interference (EMI) measuring device. The EMI measuring device according to the present invention includes an electromagnetic wave eliminating unit eliminating remaining electromagnetic waves from a DUT in response to an eliminating control signal of the control unit. The control unit may calculate EMI of the DUT on the basis of a measured result measured before the elimination of remaining electromagnetic waves. The EMI measuring device according to the present invention may compensate for an error due to remaining electromagnetic waves and measure EMI at high accuracy.

14 Claims, 5 Drawing Sheets

ELECTROMAGNETIC INTERFERENCE MEASURING DEVICE AND ELECTROMAGNETIC INTERFERENCE MEASURING METHOD

CROSS-REFERENCE TO RELATED APPLICATIONS

This U.S. non-provisional patent application claims priority under 35 U.S.C. §119 of Korean Patent Application No. 10-2012-0146840, filed on Dec. 14, 2012, the entire contents of which are hereby incorporated by reference.

BACKGROUND OF THE INVENTION

The present invention disclosed herein relates to an electromagnetic interference measuring device and an electromagnetic interference measuring method. More particularly, the present invention relates to an electromagnetic interference measuring device that is related to a carbon nano tube.

Electromagnetic interference (EMI) indicates an electrical or electromagnetic interaction that occurs when devices including an electronic circuit are close to one another. In order to perform a stable operation, the device including an electronic circuit should not be affected by an external device and nor affect the external device. This is called electromagnetic compatibility (EMC) of a device.

An electromagnetic shielding material may be used to prevent electromagnetic interference. A carbon nano tube (CNT) is a material that has been mainly studied as the electromagnetic shield material, recently. The CNT has high conductivity and thus a good electromagnetic shielding property. The EMI of the CNT may be measured to verify the electromagnetic shielding property of the CNT. The EMI may be measured by using an electromagnetic wave that is generated from the CNT in response to an electromagnetic wave applied to the CNT.

SUMMARY OF THE INVENTION

The present invention provides an electromagnetic interference measuring device and an electromagnetic interference measuring method that may compensate for an error due to a remaining electromagnetic wave to be able to measure electromagnetic interference at high accuracy.

Embodiments of the present invention provide electromagnetic interference (EMI) measuring devices, including a control unit; an electromagnetic wave generating unit generating a first electromagnetic wave in response to a frequency control signal of the control unit; an electromagnetic wave applying unit providing the first electromagnetic wave to a device under test (DUT); a measuring unit measuring, in response to a measuring control signal of the control unit, a second electromagnetic wave that is emitted from the DUT in response to the first electromagnetic wave; and an electromagnetic wave eliminating unit eliminating remaining electromagnetic waves from the DUT in response to an eliminating control unit of the control unit, and wherein the control unit calculates EMI of the DUT on the basis of a measured result of the measuring unit.

In some embodiments, a frequency of the first electromagnetic wave may vary in response to the frequency control signal.

In other embodiments, the frequency of the first electromagnetic wave may sequentially increase by a predetermined step value in response to the frequency control signal.

In still other embodiments, the frequency of the first electromagnetic wave may be controlled to have a value that is equal to or larger than a default value and smaller than or equal to a critical value, in response to the frequency control signal.

In even other embodiments, the control unit may control the measuring unit and the electromagnetic wave eliminating unit with the measuring control signal and the eliminating control signal to allow the measuring operation of the measuring unit to be performed before the eliminating operation of the electromagnetic wave eliminating unit.

In yet other embodiments, a measuring location of the measuring unit may vary in response to the measuring control signal.

In further embodiments, the measuring location of the measuring unit may be controlled to have one of predetermined locations in response to the measuring control signal.

In still further embodiments, the measuring location of the measuring unit may sequentially vary on the basis of the predetermined locations.

In even further embodiments, the predetermined locations may include center of the DUT and a plurality of locations that are away by predetermined distances from the center.

In other embodiments of the present invention, electromagnetic interference (EMI) measuring methods include applying a first electromagnetic wave with a measuring frequency to a device under test (DUT); measuring, on a measuring location of the DUT, a second electromagnetic wave that is emitted from the DUT in response to the first electromagnetic wave; eliminating electromagnetic waves that remain at the DUT; and calculating EMI of the DUT by using a measured result of the second electromagnetic wave, and wherein the applying of the first electromagnetic wave, the measuring of the second electromagnetic wave, and the eliminating of the remaining electromagnetic wave are repetitively performed with an increase in measuring frequency.

In some embodiments, the measuring frequency may have a value that is equal to or larger than a default value and smaller than or equal to a critical value, and the measuring frequency may sequentially increase by a predetermined step value from the default value.

In other embodiments, the measuring location may be one of predetermined locations, and the applying of the first electromagnetic wave, the measuring of the second electromagnetic wave, and the eliminating of the remaining electromagnetic waves may be repetitively performed on all of the predetermined locations.

In still other embodiments, the predetermined locations may include center of the DUT and a plurality of locations that is away by predetermined distances from the center.

In even other embodiments, the eliminating of the electromagnetic waves from the DUT may include grounding the DUT.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF PREFERRED EMBODIMENTS

Hereinafter, preferred embodiments of the present invention will be described with reference to the accompanying drawings to fully explain the present invention in such a manner that it may easily be carried out by a person with ordinary skill in the art to which the present invention pertains. In addition, the terms to be used below are only to describe the present invention and not to limit the scope of the present invention. It should be construed that foregoing general illustrations and following detailed descriptions are exemplified and an additional explanation of claimed inventions is provided.

Figure 1:
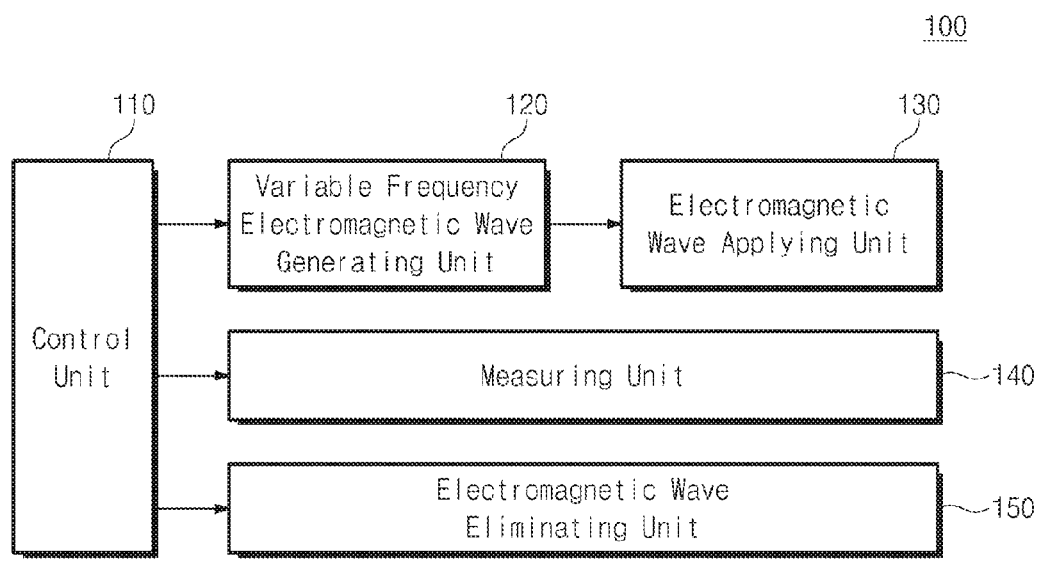
FIG. 1 is a block diagram of an electromagnetic interference measuring device according to an embodiment of the present invention.

FIG. 1 is a block diagram of an electromagnetic interference (EMI) measuring device according to an embodiment of the present invention. Referring to FIG. 1, an EMI measuring device 100 includes a control unit 110, a variable frequency electromagnetic wave generating unit 120, an electromagnetic wave applying unit 130, a measuring unit 140, and an electromagnetic wave eliminating unit 150.

The EMI measuring device 100 applies electromagnetic waves with different frequencies to a device under test (DUT) and measures electromagnetic waves that are emitted in response to the applied electromagnetic waves. The EMI measuring device 100 eliminates remaining electromagnetic waves from the DUT between measuring operations on an electromagnetic wave of each frequency to enhance measuring accuracy.

The control unit 110 controls the entire operation of the EMI measuring device 100. The control unit 110 is connected to the variable frequency electromagnetic wave generating unit 120, the measuring unit 140, and the electromagnetic wave eliminating unit 150 and controls the operation of each component.

The variable frequency electromagnetic wave generating unit 120 generates electromagnetic waves in response to control signals of the control unit 110. The frequency of the electromagnetic wave generated from the variable frequency electromagnetic wave generating unit 120 varies in response to the control signals of the control unit 110. The variable frequency electromagnetic wave generating unit 120 provides the generated electromagnetic wave to the electromagnetic wave applying unit 130.

The electromagnetic wave applying unit 130 provides the electromagnetic wave provided from the variable frequency electromagnetic wave generating unit 120, to the DUT. In this embodiment, the DUT may be a carbon nano tube (CNT). The DUT emits an electromagnetic wave in response to the electromagnetic wave provided from the electromagnetic wave applying unit 130.

The measuring unit 140 measures an electromagnetic wave that is emitted from the DUT. The measuring unit 140 transmits information on the measured electromagnetic wave to the control unit 110. The measuring unit 140 may change a measuring location of the DUT in response to a control signal of the control unit 110.

The electromagnetic wave eliminating unit 150 eliminates remaining electromagnetic waves from the DUT in response to the control signal of the control unit 110. The electromagnetic wave eliminating unit 150 may ground the DUT to eliminate remaining electromagnetic waves. The electromagnetic eliminating unit 150 may be placed between the electromagnetic wave applying unit 130 and the DUT. However, the location and the way of eliminating electromagnetic waves of the electromagnetic wave eliminating unit 150 are not limited thereto.

The control unit 110 controls the variable frequency electromagnetic wave generating unit 120 so that a frequency of an electromagnetic wave provided by the variable frequency electromagnetic wave generating unit 120 gradually increases. In addition, if the electromagnetic wave is applied by the electromagnetic wave applying unit 130 and then a measuring operation is performed by the measuring unit 140, the control unit 110 controls the electromagnetic wave eliminating unit 150 so that remaining electromagnetic waves are eliminated before the next electromagnetic wave is applied.

The EMI measuring device 100 described above measures, several times, the electromagnetic waves emitted from the CNT, by using electromagnetic waves with different frequencies. The EMI measuring device 100 eliminates remaining electromagnetic waves from the CNT between measuring operations to enhance measuring accuracy.

Figure 2:
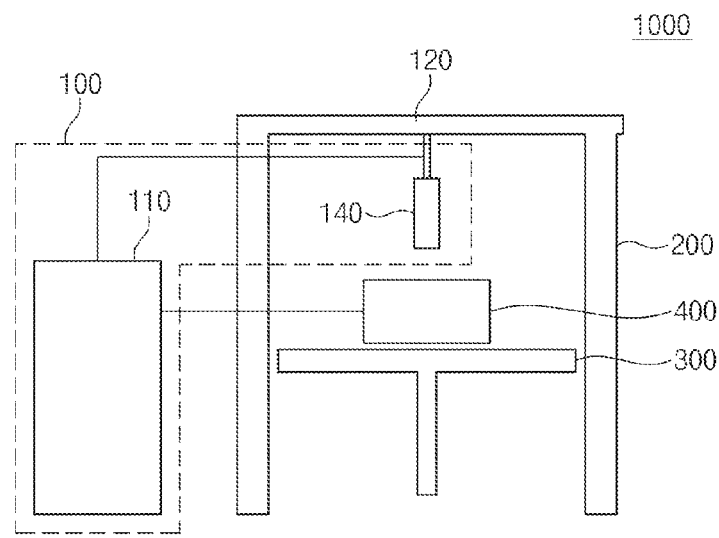
FIG. 2 is a diagram of an electromagnetic interference measuring system that includes the electromagnetic interference measuring device of FIG. 1.

FIG. 2 is a diagram of an EMI measuring system that includes the EMI measuring device of FIG. 1. Referring to FIG. 2, the EMI measuring system 1000 includes an EMI measuring device 100, a support 200, a scan table 300, and a DUT 400.

The measuring unit 140 of EMI measuring device 100 may be connected to the support 200. The relative location of the measuring unit 140 to the DUT 400 may vary. The support 200 supports the measuring unit 140 so that the measuring unit 140 may be fixed in a stable state even if the location of the measuring unit 140 varies.

The scan table 300 supports the DUT 400. The measuring range of the EMI measuring device 100 that is the moving range of the measuring unit 140 may be defined on the basis of the width of the scan table 300.

The DUT 400 is placed on the scan table 300. The DUT 400 emits an electromagnetic wave in response to an electromagnetic wave provided from the EMI measuring device 100. The electromagnetic wave emitted from the DUT 400 is measured by the measuring unit 140. In this embodiment, the DUT 400 may be a CNT or a device on which the CNT is loaded.

The EMI measuring device 100 measures, several times, electromagnetic waves emitted from the DUT 400, by using electromagnetic waves with different frequencies. In addition, the EMI measuring device 100 measures, several times, EMI on different locations of the DUT 400. The EMI measuring device 100 eliminates remaining electromagnetic waves from a CNT between measuring operations to enhance measuring accuracy.

Figure 3:
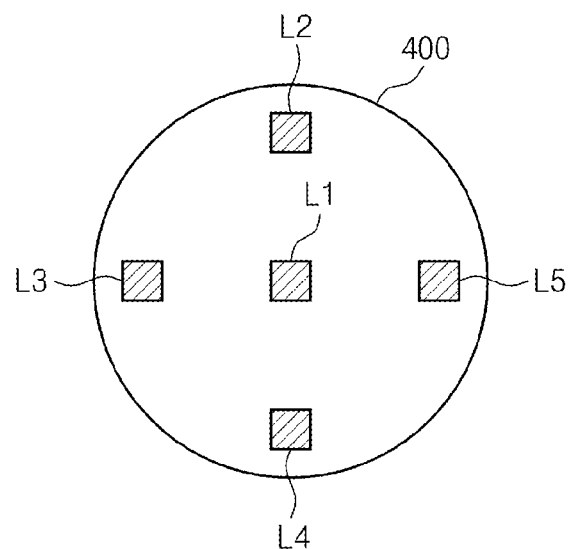
FIG. 3 is a diagram for explaining an embodiment of a measuring location of a measuring unit in the electromagnetic interference measuring system of FIG. 2.

FIG. 3 is a diagram for explaining an embodiment of a measuring location of a measuring unit in the EMI measuring system of FIG. 2. Referring to FIG. 3, the measuring unit (140 of FIG. 2) may perform measuring operations while changing a relative location to the DUT 400.

Hatching parts L1 to L5 of FIG. 3 represent exemplary measuring locations of the measuring unit 140. In this embodiment, the measuring unit 140 may measure an electromagnetic wave emitted from the DUT 400, at a first part L1 that is the center of the DUT 400, and at second to fifth parts L2 to L5 that are away by certain distances from the center.

The control unit (110 of FIG. 1) may control a measuring location of the measuring unit 140 by using a control signal. The control unit 110 may control to that the measuring location of the measuring unit 140 moves sequentially. For example, the control unit 110 may control that the measuring location of the measuring unit 140 sequentially moves in the order of the first part L1 to the fifth part L5. However, this is an example and the operation of controlling the measuring location of the control unit 110 is not limited thereto.

The control unit 110 may perform measurement several times on the first part L1 by using electromagnetic waves with different frequencies. If all measurement on predetermined frequencies at the first part L1 finishes, the control unit 110 may move the measuring unit 140 to the next point.

Alternatively, the control unit 110 may perform measurement on the first to fifth parts L1 to L5 by using electromagnetic waves with the same frequency. If all measurement on the first to fifth parts L1 to L5 finishes, the control unit 110 may increase the frequencies of the electromagnetic waves to again perform measurement on the first to fifth parts L1 to L5.

The control unit 110 may analyze the results measured on each of the parts L1 to L5 and calculate the EMI of the DUT 400. For example, the control unit 110 may calculate the EMI of the DUT 400 by using the average of the results measured on each of the parts L1 to L5. However, it is an example and calculating the EMI of the control unit 110 according to the present invention is not limited thereto.

The control unit 110 controls the electromagnetic wave eliminating unit (150 of FIG. 1) so that after a measuring operation is performed and before an electromagnetic wave is again applied to the DUT 400, remaining electromagnetic waves are eliminated from the DUT 400.

The EMI measuring device 100 measures, several times, electromagnetic waves emitted from the DUT, by using electromagnetic waves with different frequencies. In addition, the EMI measuring device 100 measures, several times, EMI on different locations of the DUT 400. The EMI measuring device 100 eliminates remaining electromagnetic waves from a CNT between measuring operations to enhance measuring accuracy.

Figure 4:
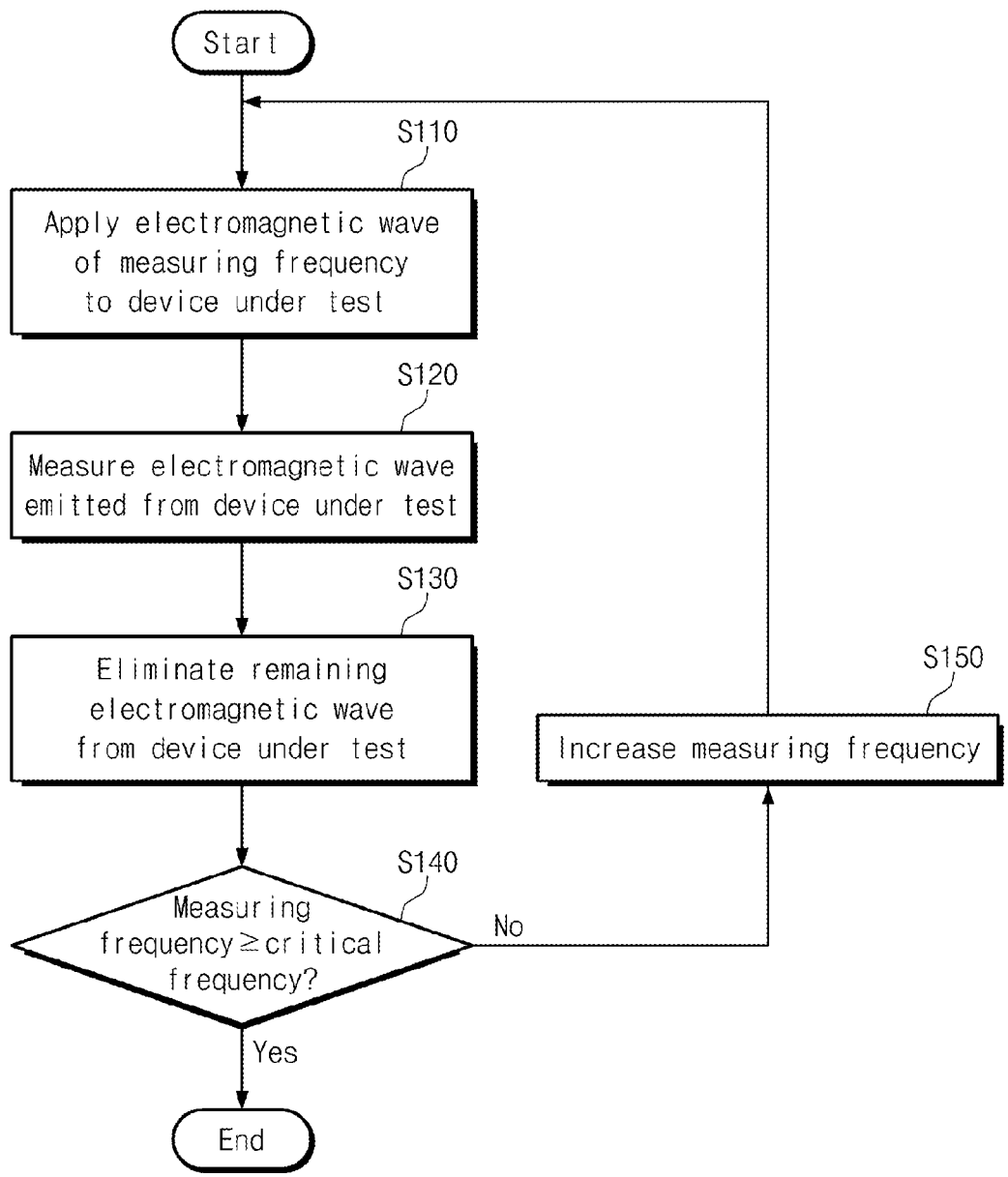
FIG. 4 is a flow chart of an electromagnetic interference measuring method according to an embodiment of the present invention.

FIG. 4 is a flow chart of an EMI measuring method according to an embodiment of the present invention.

In step S110, an electromagnetic wave with a frequency corresponding to a measuring frequency is provided to a DUT. The measuring frequency may have a predetermined default value.

In step S120, an electromagnetic wave is measured, which is emitted from the DUT in response to the electromagnetic wave provided at the step S110. The measured result may be stored for analysis.

In step S130, electromagnetic waves remaining at the DUT are eliminated. The operation of eliminating the electromagnetic waves may be performed by grounding the DUT. The eliminating operation of step S130 may be performed during the storing operation of step S120.

In step S140, it is determined whether the measuring frequency is above a critical frequency. The critical frequency is a predetermined maximum measuring frequency. If the measuring frequency is above the critical frequency, the measuring operation ends. EMI may be calculated by analyzing the stored measured result.

In step S150, if the measuring frequency is lower than the critical frequency, it increases. The measuring frequency may increase by a predetermined step value. The measuring operations of steps S110 to S140 are again performed on the increased measuring frequency.

The EMI measuring method described above measures, several times, electromagnetic waves emitted from the DUT, by using electromagnetic waves with different frequencies. The EMI measuring method may calculate the EMI of the DUT over a desired range of frequencies by using several measurement results. In addition, the EMI measuring method may eliminate electromagnetic waves remaining at a CNT between measuring operations to enhance measuring accuracy.

Figure 5:
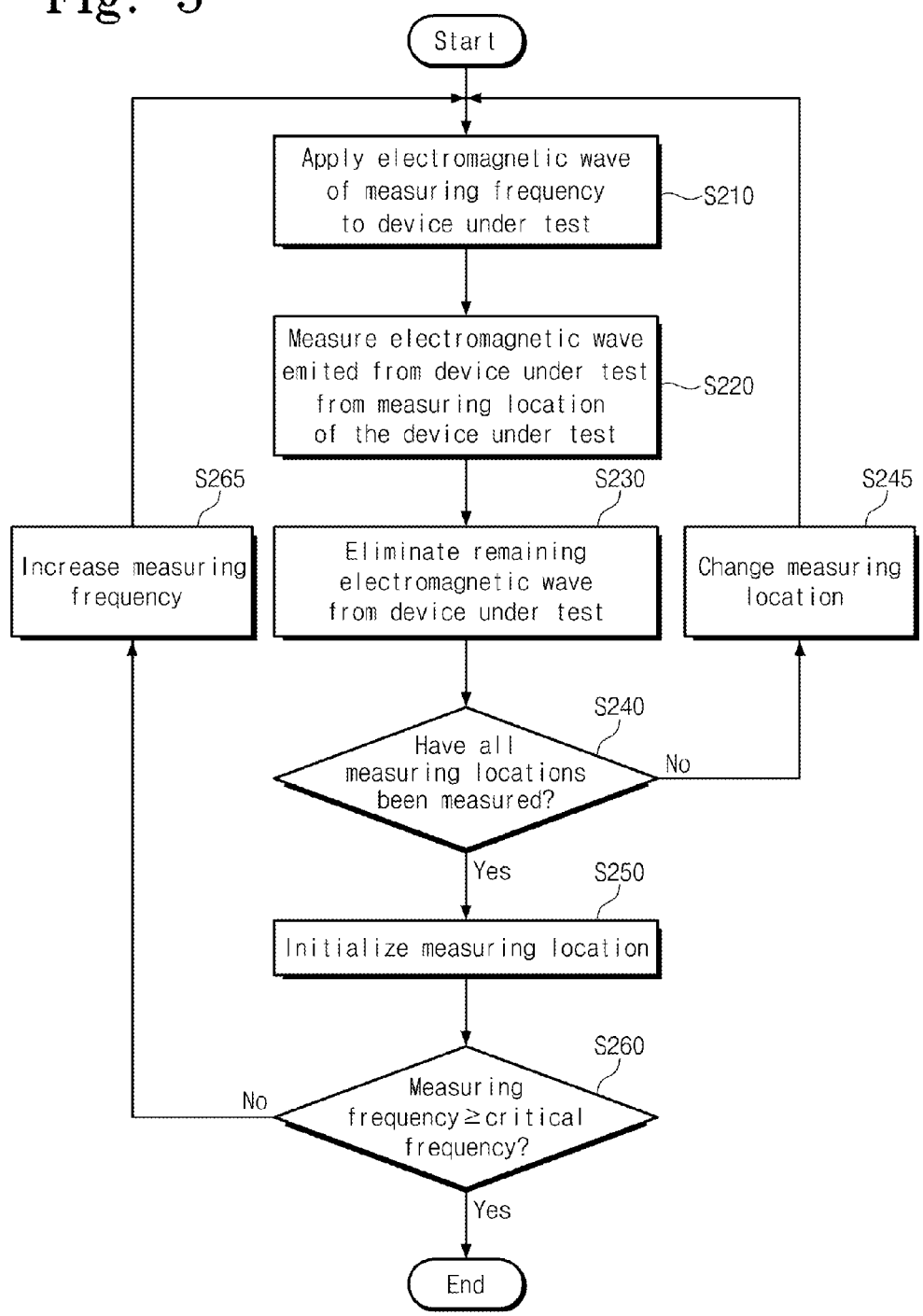
FIG. 5 is a flow chart of an electromagnetic interference measuring method according to another embodiment of the present invention.

FIG. 5 is a flow chart of an EMI measuring method according to another embodiment of the present invention.

In step S210, an electromagnetic wave with a frequency corresponding to a measuring frequency is provided to a DUT. The measuring frequency may have a predetermined default value.

In step S220, an electromagnetic wave is measured on a measuring location of the DUT, which electromagnetic wave is emitted from the DUT in response to the electromagnetic wave provided at step S210. The measuring location may be a predetermined default location. For example, the default location of the measuring location may be the center of the DUT. The measured result may be stored for analysis.

In step S230, electromagnetic waves remaining at the DUT are eliminated. The operation of eliminating the electromagnetic waves may be performed by grounding the DUT. The eliminating operation of step S230 may be performed during the storing operation of step S220.

In step S240, it is determined whether measuring operations have been performed on the current measuring frequency on all measuring locations. The number of measuring locations may be predetermined. If measuring locations have been not all measured, a measuring location is changed in step S245. The measuring operations of steps S210 to S240 are again performed on the changed measuring location.

In step S250, if it is determined that all measuring locations have been measured, a measuring location is initialized to a default location.

In step S260, it is determined whether the measuring frequency is above a critical frequency. The critical frequency is a predetermined maximum measuring frequency. If the measuring frequency is above the critical frequency, the measuring operation ends. EMI may be calculated by analyzing the stored measured result.

In step S265, if the measuring frequency is lower than the critical frequency, it increases. The measuring frequency may increase by a predetermined step value. The measuring operations of steps S210 to S260 are again performed on the increased measuring frequency.

The EMI measuring method described above measures, several times, electromagnetic waves emitted from the DUT, on a plurality of measuring locations, by using electromagnetic waves with different frequencies. The EMI measuring method may calculate the EMI of the DUT over a desired range of frequencies by using several measurement results.

In addition, the EMI measuring method may eliminate electromagnetic waves remaining at a CNT between measuring operations to enhance measuring accuracy.

Figure 6:
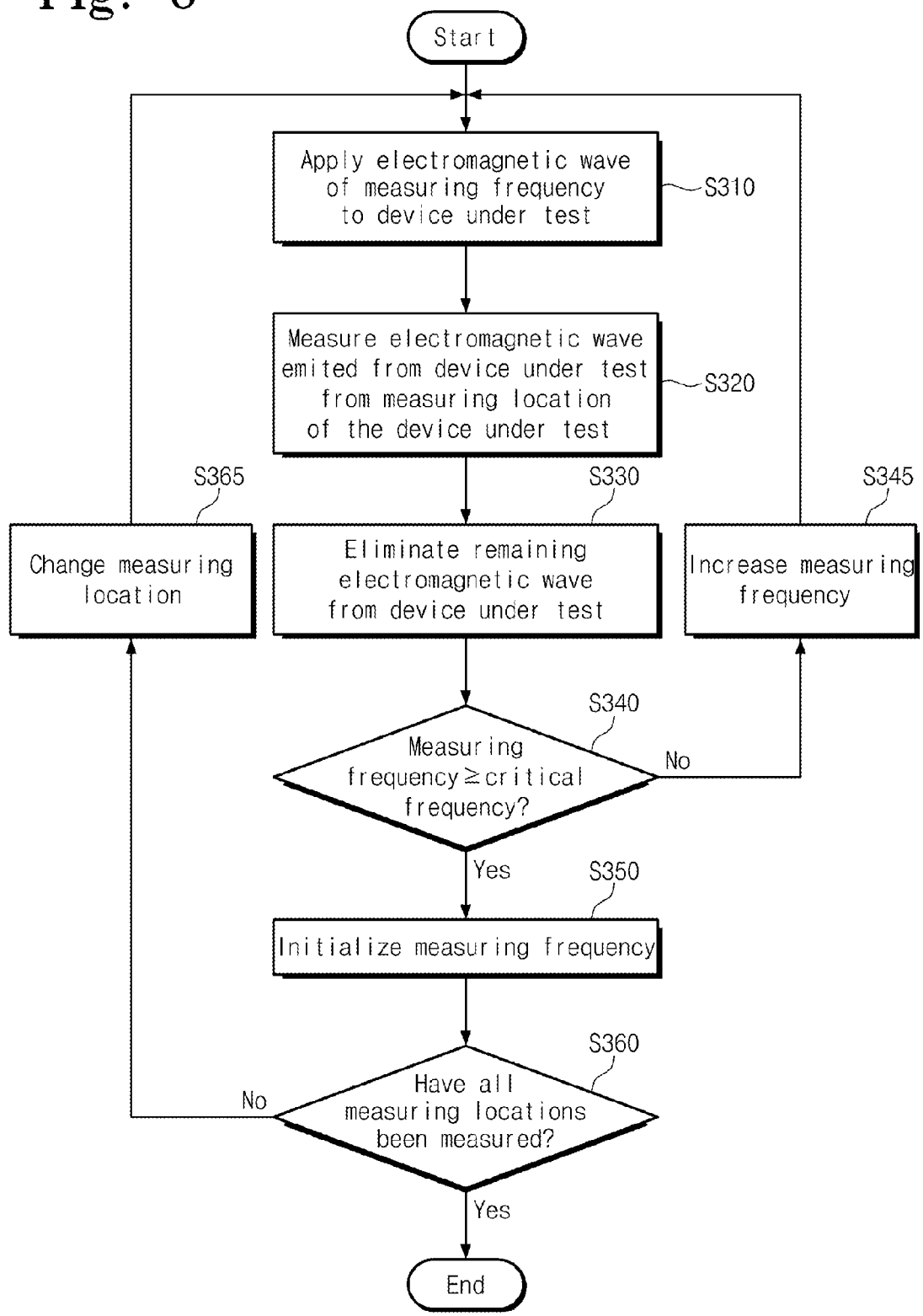
FIG. 6 is a flow chart of an electromagnetic interference measuring method according to another embodiment of the present invention.

FIG. 6 is a flow chart of an EMI measuring method according to another embodiment of the present invention.

In step S310, an electromagnetic wave with a frequency corresponding to a measuring frequency is provided to a DUT. The measuring frequency may have a predetermined default value.

In step S320, an electromagnetic wave is measured on a measuring location of the DUT, which electromagnetic wave is emitted from the DUT in response to the electromagnetic wave provided at step 310. The measuring location may be a predetermined default location. For example, the default location of the measuring location may be the center of the DUT. The measured result may be stored for analysis.

In step S330, electromagnetic waves remaining at the DUT are eliminated. The operation of eliminating the electromagnetic waves may be performed by grounding the DUT. The eliminating operation of step S330 may be performed during the storing operation of step S320.

In step S340, it is determined whether the measuring frequency is above a critical frequency. The critical frequency is a predetermined maximum measuring frequency.

In step S345, if the measuring frequency is lower than the critical frequency, it increases. The measuring frequency may increase by a predetermined step value. The measuring operations of steps S310 to S340 are again performed on the increased measuring frequency.

In step S350, if the measuring frequency is above the critical frequency, the measuring frequency is initialized to a default value.

In step S360, it is determined whether measuring operations have been performed on the current measuring frequency on all measuring locations. The number of measuring locations may be predetermined. If all measuring locations have been measured, measuring operations end. EMI may be calculated by analyzing the stored measured result.

In step S365, if measuring locations have been not all measured, a measuring location is changed. The measuring operations of steps S210 to S240 are again performed on the changed measuring location.

The EMI measuring method described above measures, several times, electromagnetic waves emitted from the DUT, on a plurality of measuring locations, by using electromagnetic waves with different frequencies. The EMI measuring method may calculate the EMI of the DUT over a desired range of frequencies by using several measurement results.

In addition, the EMI measuring method may eliminate electromagnetic waves remaining at a CNT between measuring operations to enhance measuring accuracy.

While particular embodiments have been described in the detailed description of the present invention, several variations may be made without departing from the scope of the present invention. For example, the detailed configurations of the control unit, variable frequency electromagnetic wave generating unit, electromagnetic wave applying unit, measuring unit, and electromagnetic wave eliminating unit may be changed or altered depending on their usage environment or use. While specific terms were used, they were not used to limit the meaning or the scope of the present invention described in claims, but merely used to explain the present invention. Accordingly, the scope of the present invention should not be limited to the embodiments described above and should be applied to the following claims and their equivalents.

What is claimed is:

1. An electromagnetic interference (EMI) measuring device, comprising:
a control unit;
an electromagnetic wave generating unit configured to generate a first electromagnetic wave in response to a frequency control signal of the control unit;
an electromagnetic wave applying unit configured to provide the first electromagnetic wave to a device under test (DUT);
a measuring unit configured to repeatedly measure, in response to a measuring control signal of the control unit, a second electromagnetic wave that is emitted from the DUT in response to the first electromagnetic wave; and
an electromagnetic wave eliminating unit configured to eliminate remaining electromagnetic waves from the DUT in response to an eliminating control signal of the control unit between measurements of the second electromagnetic wave by the measuring unit, and
wherein the control unit calculates EMI of the DUT on the basis of a measured result of the measuring unit.

2. The EMI measuring device of claim 1, wherein the control unit is configured to vary, in respective measurement operations, the frequency control signal to vary a frequency of the first electromagnetic wave.

3. The EMI measuring device of claim 2, wherein the control unit is configured to sequentially adjust the frequency control signal in sequential measurement operations to increase by a predetermined step value the frequency of the first electromagnetic wave sequentially.

4. The EMI measuring device of claim 3, wherein the control unit is configured to control the frequency control signal to maintain the frequency of the first electromagnetic wave to be equal to or larger than a default value and smaller than or equal to a critical value.

5. The EMI measuring device of claim 1, wherein the control unit controls the measuring unit and the electromagnetic wave eliminating unit with the measuring control signal and the eliminating control signal to allow the measuring operation of the measuring unit to be performed before the eliminating operation of the electromagnetic wave eliminating unit.

6. The EMI measuring device of claim 1, wherein the control unit is configured to control the measuring control signal to vary a measuring location of the measuring unit in respective measurement operations.

7. The EMI measuring device of claim 6, wherein the control unit is configured to control the measuring control signal to cause the measuring location of the measuring unit to be positioned in one of a plurality of predetermined locations.

8. The EMI measuring device of claim 7, wherein the measuring location of the measuring unit sequentially varies on the basis of the predetermined locations.

9. The EMI measuring device of claim 7, wherein the predetermined locations includes center of the DUT and a plurality of locations that are away by predetermined distances from the center.

10. An electromagnetic interference (EMI) measuring method of an EMI measurement device, comprising:
applying a first electromagnetic wave with a measuring frequency to a device under test (DUT);
measuring, on a measuring location of the DUT, a second electromagnetic wave that is emitted from the DUT in response to the first electromagnetic wave, and repeating the measuring based on varying the measuring frequency;

eliminating, based on a control signal from a control unit of the EMI measurement device to an electromagnetic wave eliminating unit of the EMI measurement device, electromagnetic waves that remain at the DUT between measuring operations; and calculating EMI of the DUT by using a measured result of the second electromagnetic wave, wherein the applying of the first electromagnetic wave, the measuring of the second electromagnetic wave, and the eliminating of the remaining electromagnetic wave are repetitively performed with an increase in measuring frequency.

11. The EMI measuring method of claim 10, wherein the measuring frequency has a value that is equal to or larger than a default value and smaller than or equal to a critical value, and the measuring frequency sequentially increases by a predetermined step value from the default value.

12. The EMI measuring method of claim 11, wherein the predetermined locations include center of the DUT and a plurality of locations that is away by predetermined distances from the center.

13. The EMI measuring method of claim 10, wherein the measuring location is one of predetermined locations, and the applying of the first electromagnetic wave, the measuring of the second electromagnetic wave, and the eliminating of the remaining electromagnetic waves are repetitively performed on all of the predetermined locations.

14. The EMI measuring method of claim 10, wherein the eliminating of the electromagnetic waves from the DUT comprises grounding the DUT.

* * * * *